(12) United States Patent
Dordi

(10) Patent No.: US 8,822,344 B1
(45) Date of Patent: Sep. 2, 2014

(54) METHOD OF ETCHING AN ETCH LAYER

(71) Applicant: Lam Research Corporation, Fremont, CA (US)

(72) Inventor: Yezdi N. Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 1 day.

(21) Appl. No.: 13/791,431

(22) Filed: Mar. 8, 2013

(51) Int. Cl.
*H01L 21/311* (2006.01)
*H01L 21/308* (2006.01)

(52) U.S. Cl.
CPC .................................. *H01L 21/3086* (2013.01)
USPC .................... 438/703; 438/763; 257/E21.035

(58) Field of Classification Search
USPC .................................... 438/718; 257/E21.317
See application file for complete search history.

(56) References Cited

U.S. PATENT DOCUMENTS

| 8,679,987 B2 * | 3/2014 | Reilly et al. .................. 438/781 |
| 2013/0052366 A1 | 2/2013 | Chen et al. | |

OTHER PUBLICATIONS

Sugimura et al., "Micropatterning of Alkyl- and Fluoroalkylsilane Self-Assembled Monolayers Using Vacuum Ultraviolet Light," Langmuir, 2000, 16, pp. 885-888.
Huh et al., "Lifetime of EUVL masks as a function of degree of carbon contamination and capping materials," Proc. SPIE 6921, Emerging Lithographic Technologies XII, 692115 (Mar. 20, 2008); doi:10.1117/12.772412; 9 pages.
Moon et al., "Patterning of an amine-terminated nanolayer by extreme ultraviolet," Applied Physics Letters, 91, 193104, 2007, 4 pages.
Armini et al., "Materials Engineering for Future Interconnects: 'Catalyst-Free' Electroless Cu Deposition on Self-Assembled Monolayer Alternative Barriers," Journal of The Electrochemical Society, 157 (1) 2010, D74-D80.

* cited by examiner

*Primary Examiner* — Cheung Lee
(74) *Attorney, Agent, or Firm* — Beyer Law Group LLP

(57) ABSTRACT

A method for etching an etch layer is provided. A glue layer having metallizable terminations is formed over the etch layer. The glue layer is exposed to a patterned light, wherein the metallizable terminations of the glue layer illuminated by the patterned light become unmetallizable. A metal deposition layer is formed on the glue layer, wherein the metal deposition layer only deposits on areas of the glue layer with metallizable terminations of the glue layer. The etch layer is etched through portions of the glue layer without the metal deposition layer.

19 Claims, 7 Drawing Sheets

METHOD OF ETCHING AN ETCH LAYER

FIELD OF THE INVENTION

The invention relates to a method of manufacturing semiconductor devices. More specifically, the invention relates to etching an etch layer during the manufacture of semiconductor devices.

SUMMARY OF THE INVENTION

To achieve the foregoing and in accordance with the purpose of the present invention, a method for etching an etch layer is provided. A glue layer having metallizable terminations is formed over the etch layer. The glue layer is exposed to a patterned light, wherein the metallizable terminations of the glue layer illuminated by the patterned light become unmetallizable. A metal deposition layer is formed on the glue layer, wherein the metal deposition layer only deposits on areas of the glue layer with metallizable terminations of the glue layer. The etch layer is etched through portions of the glue layer without the metal deposition layer.

In another manifestation of the invention, a method for etching an etch layer is provided. An amorphous carbon glue layer having metallizable terminations is formed over the etch layer. The amorphous carbon glue layer is exposed to a patterned ultraviolet light, wherein the metallizable terminations of the amorphous carbon glue layer illuminated by the patterned ultraviolet light become unmetallizable. A metal deposition layer is formed on the amorphous carbon glue layer, wherein the metal deposition layer only deposits on areas of the amorphous carbon glue layer with metallizable terminations of the amorphous carbon glue layer. The etch layer is etched through portions of the amorphous carbon glue layer without the metal deposition layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the formation of semiconductor devices, a photoresist mask using EUV (extreme ultraviolet) light would produce higher resolution patterns than photoresists using lower frequencies of light. Current EUV light sources generate 10 watts of power to the wafer. However, 250 watts is currently needed for a viable process that utilizes commercial EUV photoresists. In particular, the commercial EUV photoresists are too thick for the 10 watt EUV light sources to fully penetrate.

Figure 1:
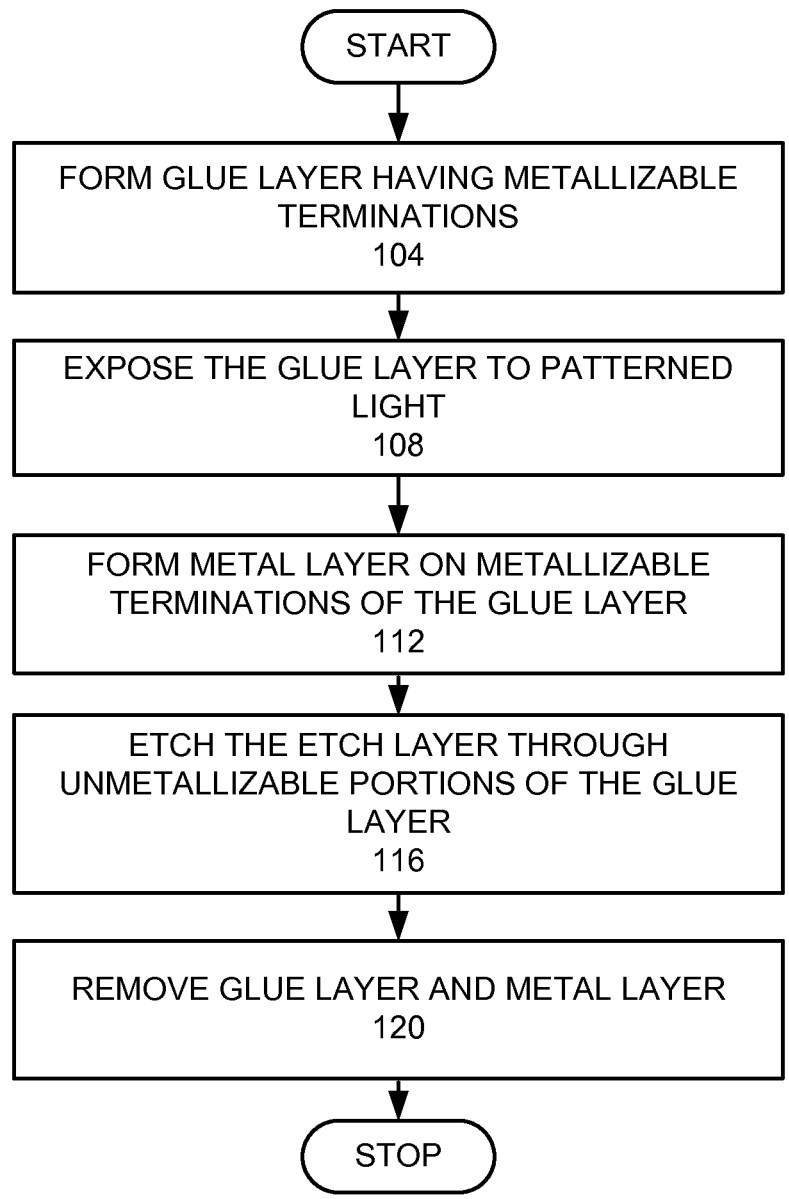
FIG. 1 is a flow chart of an embodiment of the invention.

FIG. 1 is a high level flow chart of an embodiment of the invention. In this embodiment, a glue layer having metallizable termination is formed (step 104). The glue layer is formed over an etch layer. The glue layer is exposed to a patterned light (step 108). In particular, the metallizable terminations of the glue layer that are illuminated by the patterned light become unmetallizable. A metal deposition layer is formed on the glue layer (step 112). The metal deposition layer only deposits on areas of the glue layer with metallizable terminations. The etch layer is etched (step 116). In particular, the etch layer is etched through unmetallizable portions of the glue layer without the metal deposition layer. The glue layer and metal layer are removed (step 120).

EXAMPLE

Figure 2A:
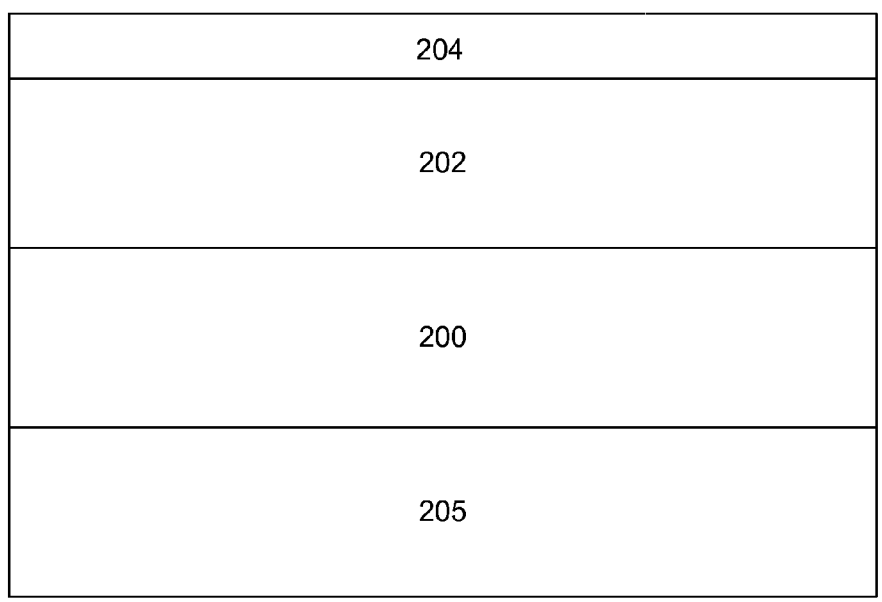
FIGS. 2A-2F are schematic views of the formation of structures using the inventive process.

In an embodiment of the invention, an exemplary method for etching a etch layer is provided. Initially, a glue layer having metallizable terminations is formed over the etch layer (step 104). The etch layer may be a layer above a silicon wafer, or it may be the silicon wafer itself. The etch layer may be a single layer or a stack of different layers, such as a composite stack consisting of a dielectric hardmask and an oxide layer. The etch layer may be one or more of a dielectric layer and/or conductive layer. Accordingly, FIG. 2A illustrates a glue layer 202, in accordance with embodiments of the present invention. In particular, FIG. 2A includes an etch layer 200, glue layer 202, and metallizable terminations 204. In this embodiment, a two-step process is used to form the glue layer 202. The glue layer 202 is formed by covering the etch layer 200 with an amorphous carbon layer and then passing the amorphous carbon layer through an ammonia plasma so as to form amine terminations. The amine terminations of the glue layer 202 are metallizable terminations 204. The metallizable terminations 204 allow a metal layer to attach to the glue layer 202. In this embodiment, the etch layer 200 is over a substrate 205. One or more layers may be between the etch layer 200 and the substrate 205. In other embodiments, the etch layer may be the substrate 205 without an underlying layer. In this example, the etch layer is an oxide layer. An example of a two step process would use a TCP chamber built by Lam Research® of Fremont, Calif. The glue layer would be provided by providing a glue layer gas of 350 sccm $H_2$, 50 sccm $CH_4$, and 200 sccm He. 500 watts of TCP power are provided to form the glue layer gas into a plasma. The bias is provided at 0 volts. A pressure is maintained at 20 mTorr. The plasma is maintained for 15 seconds. The metallizable terminations are formed by providing a metallizable termination gas of 350 sccm $H_2$ and 50 sccm $NH_3$ from a gas source into the TCP chamber. 500 watts of TCP power are provided to form the metallizable termination gas into a plasma. The bias is provided at 0 volts. A pressure is maintained at 20 mTorr. The plasma is maintained for 10 seconds.

Figure 2B:
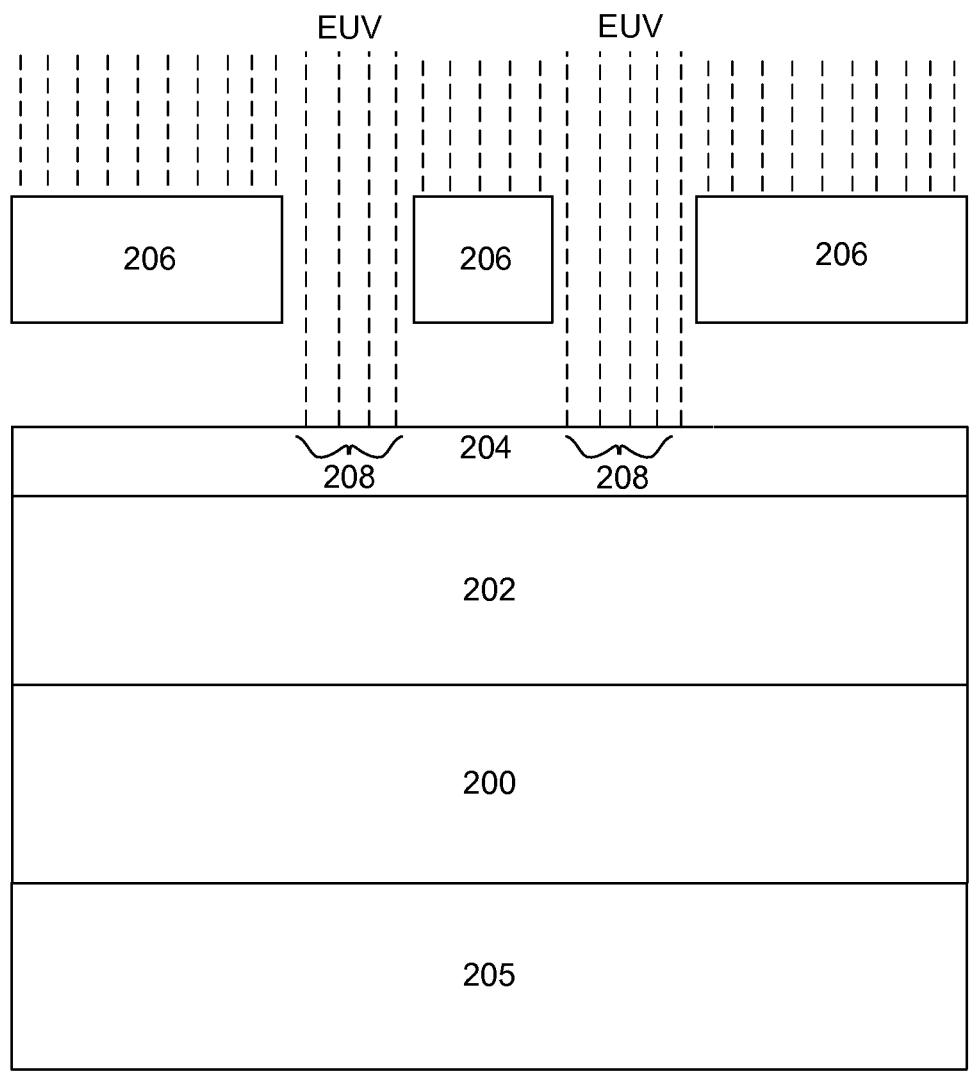

As illustrated in FIG. 2B, the glue layer 202 is exposed to a patterned light (step 108). In this example, the patterned light comprises exposure of EUV. This is achieved by placing reticle 206 over the glue layer 202. Accordingly, portions 208 of the metallizable terminations 204 of the glue layer 202 are exposed to EUV. The portions 208 of the metallizable terminations 204 that are exposed to the EUV become unmetallizable. The EUV source may provide an intensity of about 10 Watts to the wafer.

Figure 2C:
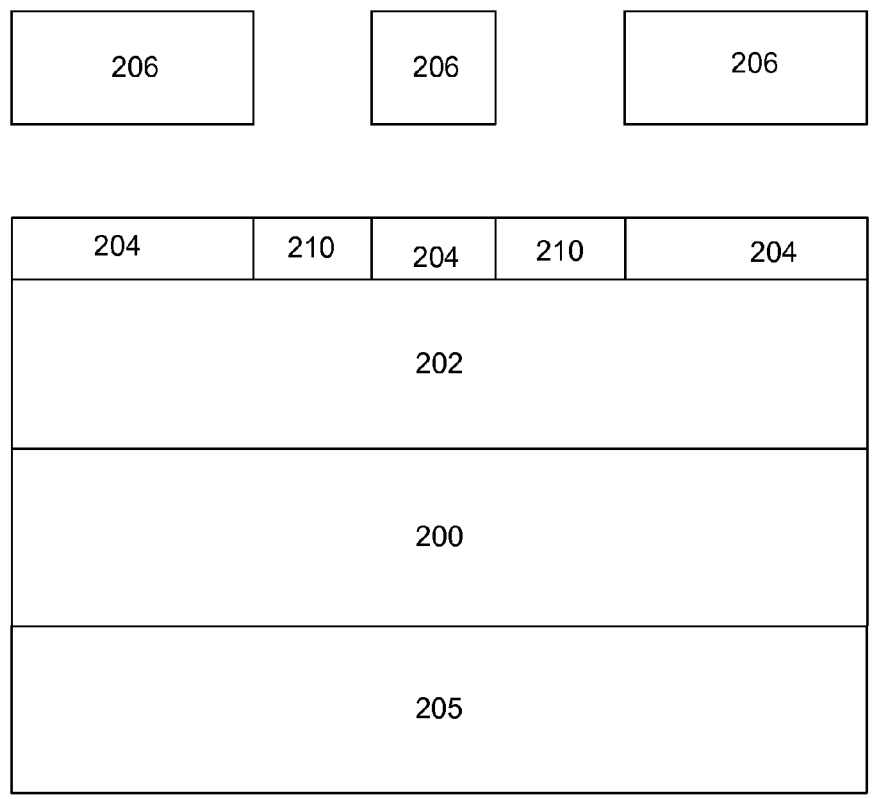

In this example, covalent bonds within metallizable terminations are broken by exposure to EUV. The metallizable terminations 204 become unmetallizable when their covalent bonds are broken. Accordingly, FIG. 2C illustrates portions 208 as being unmetallizable terminations 210. For purposes of illustration, the denaturing of the metallizable terminations 204 is shown as the transformation of the portions 208 to unmetallizable terminations 210.

Figure 2D:
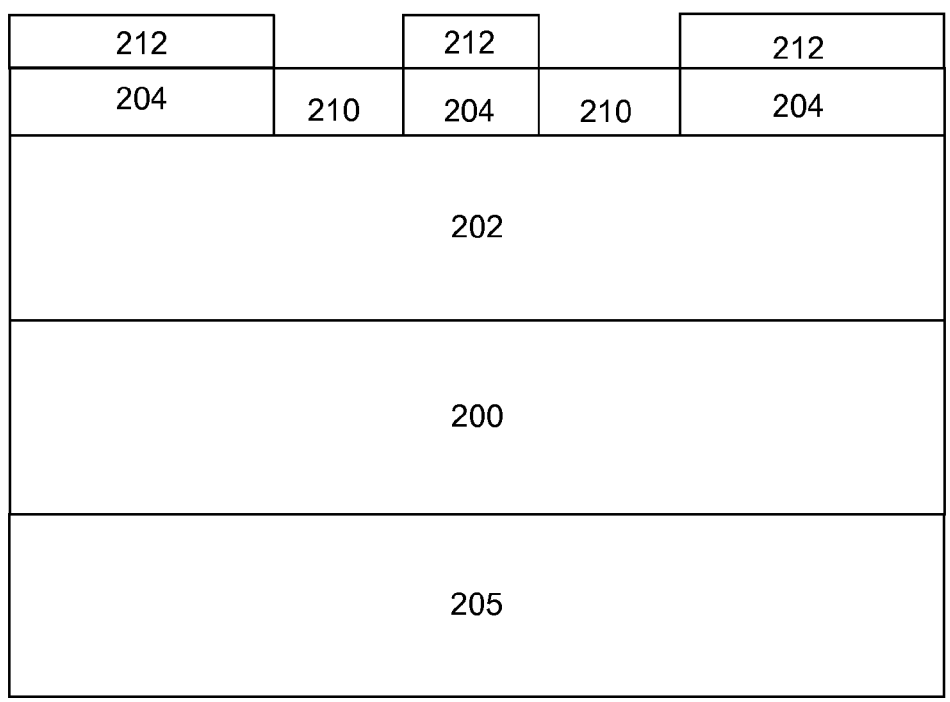

In FIG. 2D, a metal deposition layer 212 is formed on the glue layer 202 (step 112). Portions of the glue layer 202 that are metallizable are covered with the metal deposition layer 212. The metal deposition layer 212 is attached to metallizable terminations 204 of the glue layer 202. Portions that have been transformed to unmetallizable terminations 210 do not have a metal deposition layer. In particular, the metals that may be deposited on a glue layer, such as glue layer 202, are associated with particular metallizable terminations. Some metals, such as cobalt and copper, may attach to amine-based metallizable terminations. In this embodiment, a cobalt metal deposition layer 212 is attached to glue layer 202 by attaching to the amine metallizable terminations using electroless deposition. Further, the unmetallizable terminations 210 are not covered with a metal deposition layer 212. In an example of an electroless deposition, the glue layer is subjected to a palladium (Pd) treatment of a solution of 0.1 g/L of $PdCl_2$ and 3.5 ml/L of 36% HCl for 1 minute. The glue layer is then rinsed with deionized water. The glue layer is then exposed to a solution of 0.05 M $CoSO_4$, 0.2 M dimethylamine borane (DMAB), and 0.01 M diethylenetriamine for 1 to 3 minutes. The glue layer is then rinsed and dried.

Figure 2E:
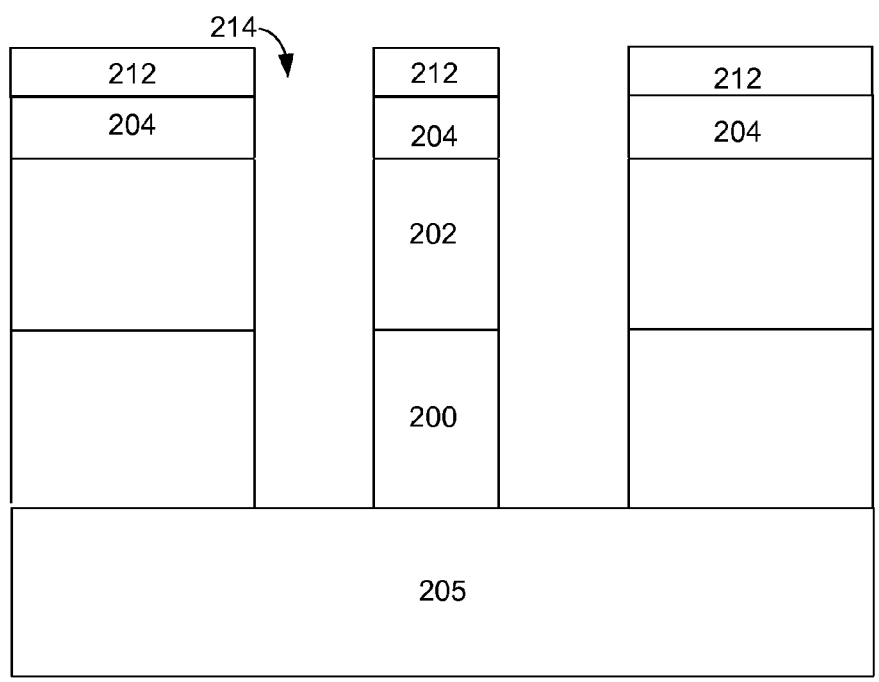

The metal deposition layer 212 is used as a patterned mask to etch the etch layer 200 (step 116). The portions of the mask with the unmetallizable terminations 210 are etched through while the portions of the mask with metallizable terminations 204 and having a metal deposition layer 212 are protected. In this example, a single etch step is used to etch both the portions of the mask without a metal deposition layer 212 and the etch layer 200. In other embodiments, different etch processes may be used to etch the glue layer 202 and the etch layer 200. FIG. 2E illustrates the etched portions 214 of etch layer 200. In this example, the features have a CD width of less than 12 nm and a depth of at least 60 nm.

Figure 2F:
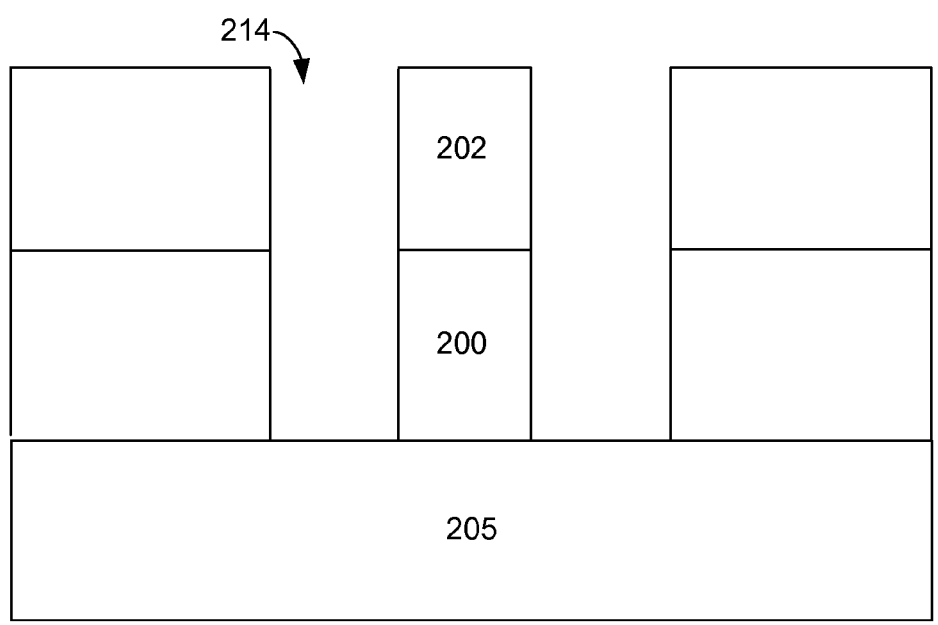

The glue layer 202 and metal deposition layer 212 are removed (step 120). In this embodiment a wet etch may be use to remove the glue layer 202 and the metal deposition layer 212 and to provide a post etch wet clean. FIG. 2F illustrates the etch layer 200 after the glue layer and the metal deposition layer have been removed.

This embodiment allows for the formation of etch features using a mask that is exposed to EUV. Since EUV has a higher frequency than deep ultraviolet (DUV), the resulting features have a lower CD than features formed using DUV. The invention allows for low intensity EUV, with an intensity of 10 Watts, to be used for forming a patterned mask in an etching process. This embodiment also allows for the formation of a metal patterned mask, which may be used to increase etch selectivity.

In other embodiments, the glue layer may be formed using a single step process, such as by using self-assembled monolayer (SAM) process or a Post Etch Treatment (PET) process, which form the glue layer and metallizable terminations in a single step. In a preferred embodiment of the present invention a two step formation of the glue layer, is used to reduce defects.

In another embodiment, the glue layer is formed using an atomic deposition layer (ALD) process. During ALD, the glue layer may be formed in a level-by-level process with desired materials deposited during multiple steps.

In embodiments, glue layer may be other carbon-based materials or may be silicon-based. A silicon-based glue layer may be formed using a polysilicon or a silicon nitride. In some embodiments, one or more layers may be disposed between the glue layer and etch layer.

Various metals may be used as metal deposition layers in accordance with embodiments of the present invention. In particular, palladium, nickel, cobalt, and copper may be used in association with amine metallizable terminations. In contrast, aluminum, nickel, and titanium would more ideally attach to oxygen-based metallizable terminations, such as —COOH. In other embodiments, metallizable terminations may include amine, thiol, and carboxylic acid. Other embodiments may use other deposited metals, such as tantalum, which attaches to oxygen-based metallizable terminations. Other metals that may be used as metal deposition layers include ruthenium, palladium, iron, and tungsten.

An above example provides electroless deposition in an aqueous solution. In other embodiments, electroless deposition may be provided in a nonaqueous solution.

In other embodiments in place of electroless deposition, nanoparticles of metal are provided to the metallizable terminations. Such nanoparticles attach to the metallizable terminations. Nanoparticles of metal are particles that are between 1 nm to 100 nm in diameter. When the nanoparticles in a suspension contact a metallizable termination, they coalesce to reach a lower energy level combining with each other and attaching to the metallizable termination. In another embodiment, atomic layer deposition is used to form the metal layer on the metallizable terminations. Other methods may be used to form the metal layer on the metallizable terminations. Such methods would attach metal to the metallizable terminations, but not to the unmetallizable terminations, forming a layer without defect and with a thickness, preferably between 1 nm to 100 nm in diameter. A layer without defects preferably would not have holes in the metal layer where there are metallizable terminations and would not deposit metal where there are unmetallizable terminations.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching an etch layer, comprising:
   forming a glue layer having metallizable terminations over the etch layer;
   exposing the glue layer to a patterned light, wherein the metallizable terminations of the glue layer illuminated by the patterned light become unmetallizable;
   forming a metal deposition layer on the glue layer, wherein the metal deposition layer only deposits on areas of the glue layer with metallizable terminations of the glue layer; and
   etching the etch layer through portions of the glue layer without the metal deposition layer.

2. The method of claim 1, wherein the metal deposition layer attaches to the metallizable terminations.

3. The method, as recited in claim 2, wherein the patterned light is ultraviolet light.

4. The method, as recited in claim 2, wherein the patterned light is extreme ultraviolet light.

5. The method of claim 4, wherein terminations become unmetallizable when the patterned light breaks covalent bonds of the metallizable terminations.

6. The method of claim 5, wherein the glue layer is carbon-based.

7. The method of claim 5, wherein the glue layer is amorphous carbon.

8. The method of claim 4, wherein the glue layer is silicon-based.

9. The method of claim 5, further comprising removing the metal deposition layer and the glue layer.

10. The method of claim 5, wherein the metallizable terminations comprise at least one of an amine or an oxygen based metallizable termination.

11. The method, as recited in claim 1, wherein the patterned light is ultraviolet light.

12. The method, as recited in claim 1, wherein the patterned light is extreme ultraviolet light.

13. The method of claim 1, wherein terminations become unmetallizable when the patterned light breaks covalent bonds of the metallizable terminations.

14. The method of claim 1, wherein the glue layer is carbon-based.

15. The method of claim 1, wherein the glue layer is amorphous carbon.

16. The method of claim 1, wherein the glue layer is silicon-based.

17. The method of claim 1, further comprising removing the metal deposition layer and the glue layer.

18. The method of claim 1, wherein the metallizable terminations comprise at least one of an amine or an oxygen based metallizable termination.

19. A method for etching an etch layer, comprising:
    forming an amorphous carbon glue layer having metallizable terminations over the etch layer;
    exposing the amorphous carbon glue layer to a patterned ultraviolet light, wherein the metallizable terminations of the amorphous carbon glue layer illuminated by the patterned ultraviolet light become unmetallizable;
    forming a metal deposition layer on the amorphous carbon glue layer, wherein the metal deposition layer only deposits on areas of the amorphous carbon glue layer with metallizable terminations of the amorphous carbon glue layer, wherein the metal deposition layer attaches to the metallizable terminations; and
    etching the etch layer through portions of the amorphous carbon glue layer without the metal deposition layer.

\* \* \* \* \*